United States Patent
Spitzl et al.

(10) Patent No.: US 9,227,169 B2
(45) Date of Patent: Jan. 5, 2016

(54) PLASMA REACTOR FOR CARRYING OUT GAS REACTIONS AND METHOD FOR THE PLASMA-SUPPORTED REACTION OF GASES

(71) Applicant: Iplas GmbH, Troisdorf (DE)

(72) Inventors: Ralf Spitzl, Troisdorf (DE); Arno Behr, Dortmund (DE); Christian Wolff, Dortmund (DE); Thorsten Oberreuther, Dortmund (DE)

(73) Assignee: Iplas GmbH, Troisdorf (DE)

( * ) Notice: Subject to any disclaimer, the term of this patent is extended or adjusted under 35 U.S.C. 154(b) by 0 days.

(21) Appl. No.: 14/107,799

(22) Filed: Dec. 16, 2013

(65) Prior Publication Data

US 2014/0183033 A1   Jul. 3, 2014

Related U.S. Application Data

(62) Division of application No. 10/521,874, filed as application No. PCT/EP03/07993 on Jul. 22, 2003, now Pat. No. 8,636,960.

(30) Foreign Application Priority Data

Jul. 23, 2002  (DE) .................................. 102 33 538

(51) Int. Cl.
*B01J 19/12*   (2006.01)
*B01D 53/32*   (2006.01)
(Continued)

(52) U.S. Cl.
CPC ............... *B01J 19/126* (2013.01); *B01D 53/32* (2013.01); *C01B 3/384* (2013.01); *C01B 21/16* (2013.01); *C01C 1/0417* (2013.01); *H01J 37/3244* (2013.01); *H05B 6/78* (2013.01); *H05B 6/80* (2013.01); *H05B 6/806* (2013.01); *B01J 2219/0254* (2013.01); *B01J 2219/0286* (2013.01); *B01J 2219/0869* (2013.01); *B01J 2219/0871* (2013.01); *B01J 2219/0883* (2013.01); *B01J 2219/0892* (2013.01); *B01J 2219/0894* (2013.01); *B01J 2219/1227* (2013.01); *C01B 2203/0233* (2013.01);
(Continued)

(58) Field of Classification Search
None
See application file for complete search history.

(56) References Cited

U.S. PATENT DOCUMENTS 3,154,682 A   10/1964   Hartz et al.
5,015,442 A    5/1991   Hirai
(Continued)

FOREIGN PATENT DOCUMENTS

DE   19600223   7/1997
EP   0768702    4/1997
(Continued)

OTHER PUBLICATIONS

English translation of the International Preliminary Examination Report (IPER) dated Aug. 27, 2004 from PCT/EP03/007993.

*Primary Examiner* — Kishor Mayekar
(74) *Attorney, Agent, or Firm* — D. Peter Hochberg; Sean F. Mellino

(57) ABSTRACT

A device for carrying out gas reactions, comprising a plasma reactor with a through-flow of gases which has a, particularly cylindrical, plasma chamber, wherein flow-forming elements for forming a flow of gases are arranged before and/or in and/or after the plasma reactor in order to form a gas stream within the plasma chamber such that at least one, particularly central, zone in the gas flow is formed which is flow-reduced. A method for carrying out gas reactions is also provided.

24 Claims, 4 Drawing Sheets

(51) Int. Cl.
  *C01B 3/38* (2006.01)
  *C01B 21/16* (2006.01)
  *C01C 1/04* (2006.01)
  *H01J 37/32* (2006.01)
  *H05B 6/78* (2006.01)
  *H05B 6/80* (2006.01)

(52) U.S. Cl.
  CPC ... *C01B2203/0238* (2013.01); *C01B 2203/107* (2013.01); *C01B 2203/1023* (2013.01); *C01B 2203/1041* (2013.01); *C01B 2203/1047* (2013.01); *C01B 2203/1064* (2013.01); *C01B 2203/1076* (2013.01); *C01B 2203/1082* (2013.01); *C01B 2203/1241* (2013.01)

(56) References Cited

U.S. PATENT DOCUMENTS

| | | | |
|---|---|---|---|
| 5,418,430 | A | 5/1995 | Bayliss |
| 6,007,785 | A | 12/1999 | Liou |
| 6,126,779 | A | 10/2000 | Gillespie et al. |
| 6,357,386 | B1 | 3/2002 | Keller |
| 8,636,960 | B2 * | 1/2014 | Spitzl et al. .................. 422/186 |

FOREIGN PATENT DOCUMENTS

| | | |
|---|---|---|
| JP | S634615 | 1/1988 |
| WO | WO 98/19965 | 5/1998 |

* cited by examiner

| Production of synthesis gas without addition of hydrogen | | | | |
|---|---|---|---|---|
| $CO_2 + CH_4 \rightarrow 2\ CO + 2\ H_2$ | | | $Ar/CO_2/CH_4 = 68/18/13\%$ | |
| P=4500W | | V=40 l/min | No Catalyst | |
| Conversion | | | Yield | |
| $CO_2$ | $CH_4$ | $H_2$ | CO | $H_2$ |
| 0.91 | 0.99 | – | 0.83 | 0.93 |

| Production of synthesis gas with addition of hydrogen | | | | |
|---|---|---|---|---|
| $CO_2 + CH_4 \rightarrow 2\ CO + 2\ H_2$ | | | $Ar/CO_2/CH_4/H_2 = 70/15/11/4\%$ | |
| P=5000W | | V=40 l/min | No Catalyst | |
| Conversion | | | Yield | |
| $CO_2$ | $CH_4$ | $H_2$ | CO | $H_2$ |
| 0.95 | 0.99 | 0.10 | 0.96 | 0.95 |

| Production of acetylene | | | | |
|---|---|---|---|---|
| $CO_2 + C_2H_4 \rightarrow C_2H_2 + CO + H_2O$ | | | $Ar/CO_2/C_2H_4 = 73/21/6\%$ | |
| P=3500W | | V=38.5 l/min | No Catalyst | |
| Conversion | | | Yield | |
| $CO_2$ | $C_2H_4$ | $H_2$ | CO | $C_2H_2$ |
| 0.21 | 0.55 | – | 0.17 | 0.07 |

| Production of benzene on copper catalysts | | | | |
|---|---|---|---|---|
| $2\ CO_2 + 2\ C_2H_4 + 3\ H_2 \rightarrow C_6H_6 + 4\ H_2O$ | | | $Ar/CO_2/C_2H_4/H_2 = 66/19/9/6\%$ | |
| P=4500W | | V=42.5 l/min | Copper Catalyst | |
| Conversion | | | Yield | |
| $CO_2$ | $C_2H_4$ | $H_2$ | CO | $C_6H_6$ |
| 0.37 | 0.23 | 0.65 | 0.25 | 0.02 |

FIG-6

PLASMA REACTOR FOR CARRYING OUT GAS REACTIONS AND METHOD FOR THE PLASMA-SUPPORTED REACTION OF GASES

CROSS-REFERENCE TO RELATED APPLICATIONS

This application is a divisional application of application Ser. No. 10/521,874, filed on Jul. 25, 2005 (issued as U.S. Pat. No. 8,636,960 on Jan. 28, 2014), which is a 35 U.S.C. 371 national stage filing of International Application No. PCT/EP2003/007993 filed on Jul. 22, 2003, which claims priority of German application number 102 33 538.9, filed on Jul. 23, 2002. The contents and disclosures of all the aforementioned applications are incorporated herein by reference in their entireties.

BACKGROUND OF THE INVENTION

1. Field of the Invention

The invention relates to a device for carrying out gas reactions, the device comprising a plasma reactor with a through-flow of gases, particularly a large-volume plasma reactor, which has a plasma chamber, particularly a cylindrical plasma chamber. The invention further relates to a method for carrying out gas reactions wherein a flow of gases or a flow of gasifiable substances is guided through a plasma, especially a plasma that is excited by microwaves.

2. Description of the Prior Art

Gases may flow through a device comprising a plasma reactor, particularly a cylindrical plasma reactor, to which microwaves are fed via coupling points, whereupon gas reactions may occur due to high excitation of the gases by the plasma. In particular, it is possible to carry out syntheses of substances and gas purifying reactions.

Known devices for the production of microwave plasmas consist of a plasma chamber, a microwave-feeding resonator with a microwave generator for producing the plasma, and coupling points, e.g. slots, antennas or the like, which are regularly arranged in the metal wall between the resonator and the plasma chamber for coupling the microwave into the plasma chamber.

Known plasma reactors for carrying out gas reactions use thermal plasma jets that require high powers of several times 10 kW and which heat the process gases to several times 1000 or even 10000 K. The power is introduced into small plasma volumes of several cubic centimeters ($cm^3$) with power densities of several times 1000-10000 $W/cm^3$.

According to DE 19 600 223, the resonator, in the form of a ring of rectangular cross-section, surrounds the metal wall with coupling points of the cylindrical, tubular plasma chamber.

Arrangements according to DE 19600223, for example, indeed produce non-equilibrium or non-thermal plasmas, in plasma chambers having a volume of several times 1000 $cm^3$ and power densities of several $W/cm^3$, at a microwave excitation frequency of 2.45 GHz, but they do not permit throughput of larger volume flows and corresponding gas velocities. The efficiency of such non-thermal plasmas, i.e. power input/turnover is markedly better as there is not as much energy wasted on the—generally useless—heating of the neutral gas.

Also suitable as microwave excitation frequency are, in particular, the commercially employed 915 MHz and 440 MHz, with correspondingly scaled plasma sources.

Known resonators that may be employed in accordance with the invention may also enclose a cylindrical wall of the plasma chamber with coupling points, either completely or as segments of a jacket having the same longitudinal axis, or they may be arranged within the cylindrical plasma chamber, e.g. in its axis. Due to the geometry of the resonator and the essentially tubular-cylindrical plasma chamber, and due to the regular arrangement of the coupling points between resonator and plasma chamber, certain wave patterns, so-called modes, are produced in the interior of the plasma chamber with optimal effectiveness of the plasma. The microwave generator may also be complemented or replaced by chemical, electromagnetic or high-frequency excitation.

Gases in the plasma chamber are excited by the plasma, whereby, inter alia, luminous effects are created. With the known reactors, it is of disadvantage that a gas flow disturbs the plasma even at low flow rates and pushes the plasma out of the chamber and causes the plasma to break down, which is thereby extinguished. It is not possible to achieve high gas throughputs and high gas flow velocities with the known reactors.

Known gas reactions and gas syntheses can also take place in the arc with discharge electrodes; here, the temperatures are too high for many purposes, the gas flow is impeded by the electrodes, and the high energy consumption is disadvantageous.

SUMMARY OF THE PRESENT INVENTION

It is the object of the present invention to obtain a well distributed, stable, and in particular non-thermal, plasma, and thereby obtain an optimal activation of the gas, in particular, at high throughputs, in particular to harness such microwave-excited, i.e. electrode-free, large-volume plasma sources for high gas velocities of several m/s up to several times 10 m/s, and to ensure stable long-term operation, particularly at pressures of several times 100 mbar up to several times 10 bar.

To achieve this object, a plasma reactor with a through-flow of gases, for gas reactions with flow-forming elements for guiding the gas flow is proposed, as well as a method for carrying out gas reactions with high volume flows using this device.

Considered as reaction gases are, in particular, gases that are difficult to activate and are thus poorly reactive, e.g. carbon dioxide and water, as well as nitrogen, methane and natural gas.

According to the invention, it is provided to form at least one, particularly central, zone in the gas stream which is flow-reduced by means of the flow-forming elements. Within such a flow-reduced zone, it is possible to produce the plasma in a particularly stable manner.

Even at high overall gas flow velocities the plasma remains stable since in the flow-reduced area, the velocity of the gas flow is reduced, so that a break-down of the plasma is prevented even at high gas throughputs.

By means of the gas flow-forming elements it is in particular achieved that 1) only a weak contact between the plasma and the reactor wall occurs (recipient; made, for example, of a quartz glass tube or ceramics tube), and that 2) a flow-reduced zone is created (as a rule in the center of the plasma source or of the recipient).

Point 1) leads to a long service life of the device according to the invention due to the low thermal load on the recipient, and point 2.) leads to a stable power input into the plasma.

The invention relates to large-volume plasma sources, i.e. plasma sources where the plasma chamber volume is larger than the volume of a lambda piece (one wavelength) of the feed microwave guide (generally a wave guide), and/or plasma sources whose length (in the direction of the flow) is greater or equal to one wave length.

The remote region of the plasma source where the plasma is blown out by the gas flow is not counted as part of the plasma chamber volume, but only that region where the plasma is still fed with microwave power.

In particular, the invention does not relate to the known plasma jet sources, which have small plasma volumes. Likewise, the invention does not relate to the known low-pressure plasma sources.

In accordance with the invention, the device comprises a, preferably cylindrical-tubular, plasma chamber with a through-flow of gases as a plasma reactor with coupling points for feeding microwave power, possibly via a microwave-feeding resonator and flow-forming elements for forming the gas stream. The feed resonator, e.g. in the form of a wave guide ring or coaxial resonator, may completely or at least partially, enclose the plasma chamber in the form of a jacket or partial jacket, whereby the plasma chamber itself may form modes as a resonator.

In this connection, it may be provided to operate the plasma in a pulsed manner, e.g. with pulse frequencies of 1 Hz to 50 kHz. Pulsing can be produced by pulsed control of the microwave generator or pulsed coupling into the plasma reactor, particularly the resonator. In this way, the conversion of substances can be improved and the energy input increased.

The production of a plasma by microwaves has the advantage of being able to produce a non-thermal plasma, that is, a plasma which has a high energy portion with regard to the electron excitation, but shows little thermal heating. This results in an energy efficiency that is higher than compared to other ways of plasma production, e.g. by arc. The energy required is, by a factor of approximately 10 to 100, lower than in the production of thermal plasmas. Heat generated by carrying out the reaction may also be recovered by a heat exchanger which is integrated in the reaction tube. The heat exchanger comprises a black exchange surface.

At the end faces of the plasma reactor there may be provided connections for feeding of gases, and on the opposite side connections for gas outlet, with the flow-forming elements or devices distributing the gases and causing a gas stream, particularly a rotating gas stream in whose central part the rotation speed is lowest, so that in the rotation centre the flow-reduced zone is formed.

One embodiment of the invention relates to an arrangement wherein the gas stream which is fed into the plasma chamber is put in rotation immediately before the chamber, by means of flow-forming elements.

Another embodiment includes flow-forming elements which deflect the gas stream immediately after the plasma chamber and thereby cause a rotation of the gas stream in the plasma source.

The plasma chamber, which is preferably of cylindrical shape, and the arrangement of the coupling points, as well as in particular the distribution of the gas stream with at least one flow-reduced zone produce a well-distributed and stable plasma and thus optimal activation of the gases.

The process has the advantage that it is also possible to produce large plasmas, particularly at the microwave frequency of 2.45 GHz. Thus, the volume of the plasma chamber may preferably be in the range of 0.5 to 5 liters. This leads to plasma excitation zones of 1 to 2 liters, wherein, preferably, a reduction of the gas flow is produced.

The arrangement of the flow-forming elements, which preferably is symmetric to the axis of the reactor, can be exploited to produce a flow reduction in an especially effective manner, particularly by means of the above-mentioned, preferred rotation of the gas stream. The distribution and, preferably, rotation of the gases in the entire plasma chamber of the reactor and of the reaction tube by means of the flow-forming elements enable high substance or gas throughput and high conversion of the substances which are to be reacted.

The feed of the microwave power via the coupling points preferably takes place by feed ring resonators or coaxial resonators which may surround the plasma chamber as a jacket or partial jacket.

Suitable as flow-forming elements are, inter alia, baffle plates, nozzles, diaphragms, grids, cones, baffle bodies, vortex tubes, cyclones, turbines or perforated orifice plates, either as alternatives or in combination with one another.

It is preferred that the flow-forming elements be arranged to be adjustable in order to shift the gas stream if required and, for example, to calm the gas stream to a greater or lesser degree.

In particular, adjustable ring diaphragms or ring nozzles in symmetric arrangement relative to the supplied gas stream and to the axis, and/or tangentially feeding nozzles in annular arrangement enable the rotation in the reactor and the reaction tube or secondary reaction tube. Such flow-forming elements are especially effective at the gas inlet and at the gas outlet of the reactor, and at the beginning of the reaction tube.

The flow-forming elements enable an ordered, e.g. rotating, guiding of the gases and unexpectedly high gas velocities, i.e. high throughputs, whereas the gas is not driven out of the reactor completely since the flow-reduced zone provides a stable plasma.

Excitation of the gases by the plasma may take place in the reactor while the further reaction takes place only in the reaction tube. For this reason, it is preferred that a part of the gases or one of several reaction components or inert gases be supplied to the gas stream at the outlet of the reactor. Auxiliary substances can also be supplied at the gas inlet or in the reaction tube.

With the device comprising the flow-forming elements it is made possible to handle the gases in the range of atmospheric pressure at 0.1 up to 10 bar, especially at a pressure of 0.3 up to 1.5 bar. In 2.45 GHz reactors, for example, with a diameter of 100 mm, for example, gas streams of 0.1 $m^3$/h up to 300 $m^3$/h, especially of 10 to 100 $m^3$/h, for example, are achieved. In this connection, gas flow rates of 1 to 15 m/sec are achieved. Reactors with a diameter of up to 1000 mm yield substantially larger throughputs of up to several 1000 $m^3$/h.

If a reaction tube follows, this tube preferably has the same axial direction, but may have a different diameter.

The gases are activated to such a high degree by the plasma that cooling of the gases may be advantageous or necessary. For this purpose, cooling elements such as chambers or cooling jackets in the wall of the reaction tube and possibly at the gas inlet and gas outlet of the reactor may be used.

Effective cooling may, in particular, take place by means of gases in the form of a cooled gas stream or as a supply of cold gases such as argon or in the case of syntheses of part of the reaction partners at the beginning or into the reaction tube. By specific cooling it is possible to form products selectively. Cold gases are preferably supplied by means of ring nozzles, slit apertures or tangentially effective injection tubes, which may at the same time serve as flow-forming elements. By means of these cooling elements and the addition of, possibly cold, gases it is possible to set those temperature ranges which have the highest degrees of conversion and the highest yields for the respective reaction or conversion which is being carried out.

Preferred temperature ranges are from 100 to 1000 degrees Celsius. Degrees of conversion of up to 100% and yields in the range from 10% to 100% can be achieved.

A recipient which can be permeated by the microwaves, e.g. of quartz glass, ceramics or the like, may be arranged in the reactor, parallelly to the cylinder wall. The wall of the recipient may continue into the reaction tube or form the reaction tube.

Measuring instruments or tubes for sampling and/or a displaceable feed for further gases or cooling agent may protrude into the reaction tube (see FIG. 1), in particular in an axial direction from behind. In the reaction tube, catalysts of any type can be used to accelerate the respective reactions. These may be provided, in particular, on bottoms, especially in a displaceable basket, or as granules, nets or the like.

The method for carrying out gas reactions by plasma-enhanced conversion can particularly be carried out with the described device. The flow-forming elements cause a distribution of the gases which leads to a flow reduction within the gas stream, whereby particularly in the flow-reduced zone of the gas stream the gas is able to burn stably. Particular preference is given to a rotation of the gas stream, by means of which it is possible to significantly increase the flow velocity and the throughput as well as the completeness of the conversion. By cooling the device and by supplying cooled starting materials, cold gases or auxiliary materials, the throughput and, depending on the reaction that is carried out, the degree of conversion are increased.

Activation or excitation of the reaction components takes place in the plasma reactor. Activation of the gases supplied above the plasma sources takes place in the entrance to the reaction tube, as far as the plasma is driven to said entrance with the gas stream, which is possible whenever the plasma is maintained stable in the reactor. The actual conversion mainly takes place in the reaction tube.

It is often useful to guide only part of the gases or only one of several reaction components through the plasma reactor, and to feed further components, auxiliary gases or even liquid substances such as water at the beginning of the reaction tube. Particularly by feeding cold gases of any type, such as hydrogen, only into the reaction tube, or into the recombination zone, and by cooling the reaction tube, the temperature of the reaction is controlled and the quantity which is put through and the degree of conversion are increased.

Catalysts that are suitable for the respective reaction which is carried out may, for example, be applied in a known manner and shape on carriers, arranged on bottoms in the reaction tube, or, advantageously, employed in a displaceable catalyst basket. Streams of cold gases or auxiliary gases, for example, may be blown directly at sensitive catalysts. Finely dispersed powders, hence also finely dispersed catalysts, suspensions or catalytically acting gases may be guided directly through the plasma reactor.

With stationary or pulsed plasmas in the device the pressure may be 0.1 to 10 bar, particularly within the range of normal pressure.

Gas velocities of e.g. 0.1 to 10 m/s, with a tube diameter of e.g. 100 mm, that is, with a very small diameter and small apparatus, are possible.

Volume flows of gas from 1 to 300 m$^3$/h are achieved. With tube diameters of 300 to 1000 mm, correspondingly high throughputs of 100 up to several times 1000 m$^3$ are possible.

Due to the strong plasma excitation, the temperatures of the respective gas reactions are lower than in corresponding reactions carried out, for example, in the arc or by thermal excitation. For this reason, in particular so-called non-thermal plasmas in a temperature range of preferably 200 to 2000 degrees Celsius are produced with the present invention. The material of the device, inter alia stainless steel or quartz glass, is therefore only under little stress, it is not subject to material damage or corrosion and has a long service life. The catalysts, too, have long service lives.

The purification of waste gases or residual gases, for example from industrial processes, as well as the synthesis of substances can be carried through from gases or gasifiable liquids in the gaseous phase, especially from poorly activatable gases such as $CO_2$, $N_2$, $SF_6$, $CF_4$, $C_2F_6$ or $H_2O$. Gaseous or vaporous pollutants can be destroyed by means of a suitable reduction or oxidation agent in a stream of pollutants.

It is frequently possible to achieve high yields and degrees of conversion of up to 100%.

To produce synthesis gas, it is possible to utilize water vapour and hydrocarbons. It is likewise possible to produce synthesis gas from liquid or gaseous hydrocarbons and carbon dioxide at neutral gas temperatures of below 1000° C., with and without the use of catalysts.

To produce hydrogen it is possible to convert, for example, natural gas by means of, for example, argon plasmas or hydrogen plasmas.

Examples of syntheses of substances from gases are the production of ammonia from nitrogen and hydrogen in a molar ratio of 1:3, as well as pyrolysis reactions, e.g. the decomposition of methane or other hydrocarbons to hydrogen and fine-particulate, highly active carbon black, which has numerous applications, inter alia as toner for photocopiers. An important reaction is the production of synthesis gas, i.e. of CO and $H_2$ from methane or lower hydrocarbons. In this connection, deviations of 20% from the theoretical molar quantities are possible. The conversion of dry water vapour with methane takes place in a molar ratio of 1:1 and theoretically yields 3 Mol $H_2$ per mol CO. It is therefore predominantly utilized for the production of hydrogen. The conversion of $CO_2$ with hydrocarbons, calculated as methane, yields equal molar amounts of CO and $H_2$ and serves to produce subsequent products from synthesis gas. A surplus of methane, or the addition or recirculation of hydrogen decreases side reactions and makes it possible to achieve conversions of even up to 98%, with a very high selectivity. Hydrogen or recirculated synthesis gas can be added via the ring nozzle 11 according to FIG. 1, for example.

It is possible to use catalysts in the reaction tube. This applies, in particular, to heterogeneous catalysts on suitable carriers, such as aluminium oxide or silicon oxide. Also suitable as catalysts are coated monoliths as well as zeolites with and without doping.

Suitable as active components of the catalyst are, for example, all metallic oxides, e.g. iron, copper, zinc or nickel oxide, as well as mixed oxides of a plurality of metals. Apart from these oxides it is also possible to use pure metals. These are, for example, palladium, platinum, rhodium, as well as copper, iron, cobalt, titanium, nickel and zinc.

The introduction of catalysts in this context preferably takes place on displaceable bottoms.

High-quality, long-chain and/or aromatic hydrocarbons can be formed by employing gaseous olefins, namely by feeding with or without reaction with carbon dioxide and with or without catalysts.

Possible reactions with catalysts are the formation of long-chain hydrocarbons with and without insertion of oxygen, similar to the Fischer-Tropsch process, of aromatic molecules, the synthesis of ammonia, as well as the yield increase and prevention of soot formation in the production of synthesis gas. The process is thus suitable for the production of ammonia or hydrazine from mixtures of hydrogen and nitrogen, with and without the use of catalysts.

The purification of waste gases results in the complete purification, by oxidation, of a variety of waste gases from unwanted, harmful or poisonous components such as carbon monoxide, dioxin, furans, fluorochlorinated hydrocarbons, fluorohydrocarbons, chlorohydrocarbons and further carbon compounds. The device enables the supply of, for example, air or oxygen, or of reductive gases such as ammonia, hydrogen or mixtures thereof with waste gases through the gas feeds. By selecting suitable temperatures, choosing suitable additives and effective catalysts, it is thus possible to also purify waste gases that are difficult to convert or the conversion of which is frequently incomplete.

Examples of convertible waste gases are residues from the production and processing of crude oil and natural gas and from chemical reactions, as long as the residues of the starting materials or products are not worth recovering or a purification by oxidation or reduction without further conversion is necessary prior to disposal to the environment.

BRIEF DESCRIPTION OF THE DRAWINGS

The drawings of FIGS. 1 to 5 show, in section, the device according to the invention for carrying out gas reactions by means of plasma treatment. In the drawings, the known feed resonator and the coupling elements in the wall of the plasma reactor are partly omitted.

FIG. 6 shows examples of possible reactions.

DETAILED DESCRIPTION OF THE PRESENT INVENTION

Figure 1:
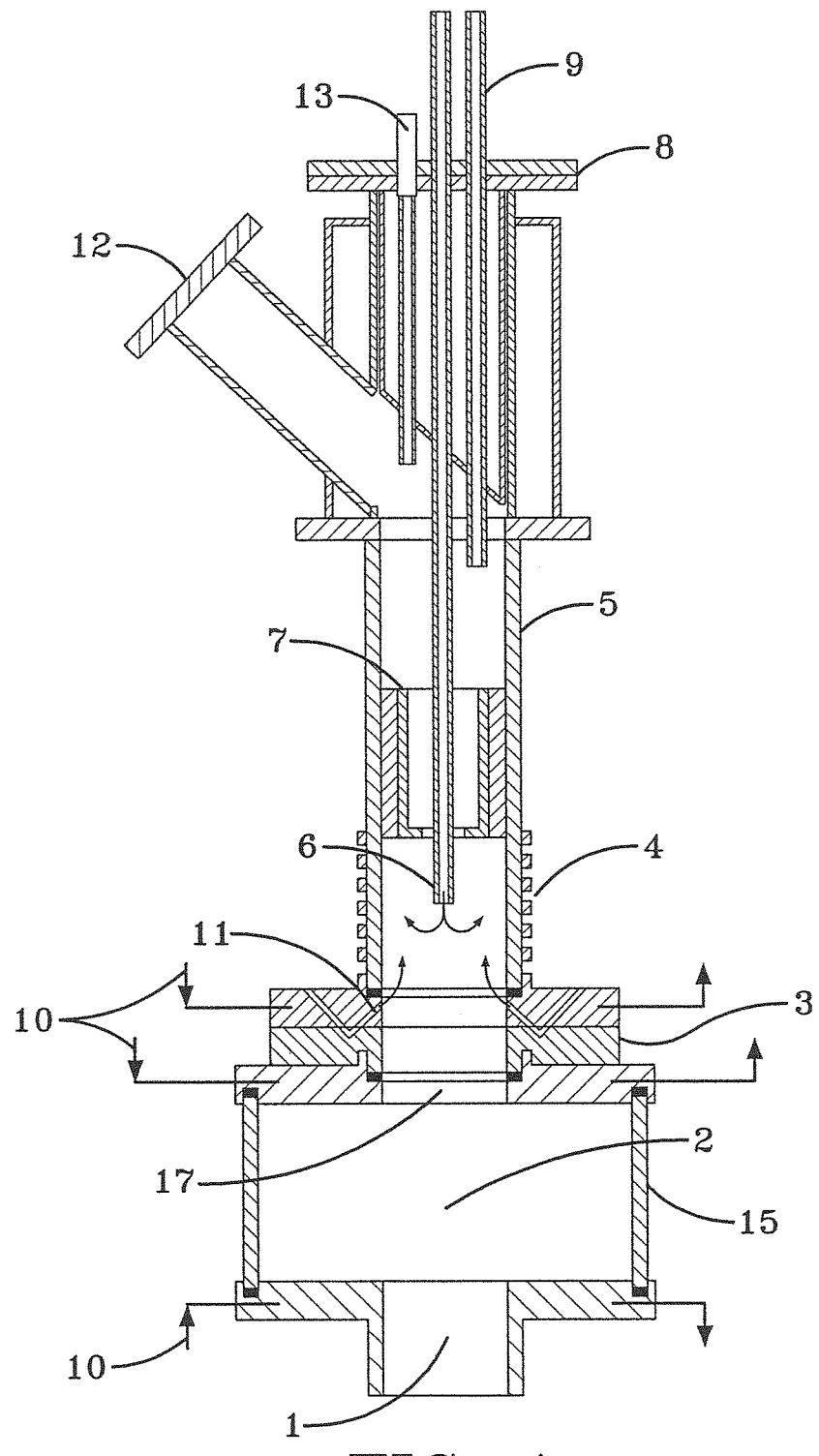

FIG. 1 shows a device, wherein a, for example, rotating, gas stream of the starting materials is introduced from below, through the end face of the plasma chamber, by means of the gas inlet 1, which is configured as a flow-forming element. The gas stream is distributed in the plasma reactor or in the plasma chamber 2, is guided further through the reaction tube 5, which has the same axis as the reactor, brought to full reaction, and is finally disposed at the gas outlet 12.

Cooling chambers 10, which are configured to be ring-shaped, and cooled rings 3 are arranged at the gas inlet into the reactor and at the gas outlet of the reactor, respectively the inlet into the reaction tube. Feed lines for further gases or auxiliary substances are arranged in the form of annular nozzles 11 at the outlet of the reactor, and as displaceable axial tube 6 with gas introduction towards the gas stream. A measuring device 13 and a displaceable sampling device 9 are inserted through the cooling head 8.

If the reaction tube 5 is made of glass, quartz or the like, it can be enclosed by a protective tube 4 of metal. The displaceably arranged catalyst basket 7 contains a catalyst which is granulated or applied to a carrier and which accelerates the respective gas reaction which is being carried out.

Figure 2:
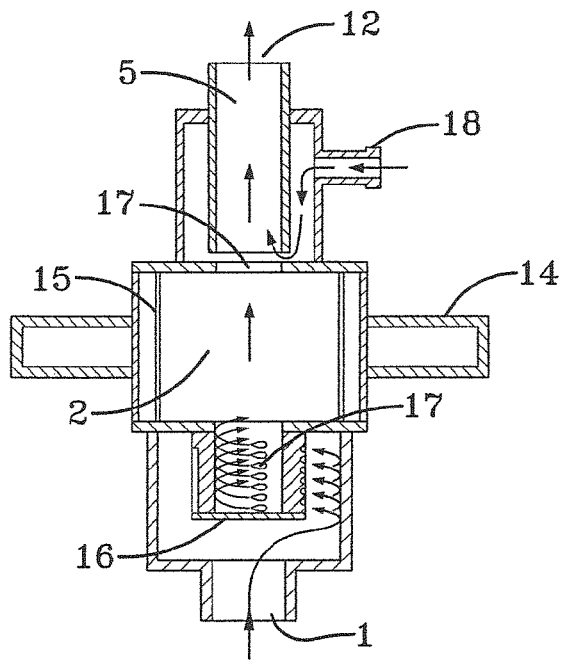

FIG. 2 shows, in section, a device for gas treatment, with plasma chamber 2, the ring-shaped plasma resonator 14 feeding the plasma, and the recipient 15 made of quartz. The gases coming from the gas inlet 1 are guided by the flow-forming element 16 in the manner of a turbulence chamber through drilled holes 17, arranged in rows, tangentially to the axis, in rotation (indicated by arrows), at high speed through the plasma chamber 2, to the perforated orifice plate into the reaction tube 5 for secondary reaction. Additional gas or a reaction component is guided through the connecting branch 18 into a jacket space surrounding the reaction tube 5, and through the annular gap 19 into the reaction tube 5, in the direction of the gas outlet 12.

Figure 3:
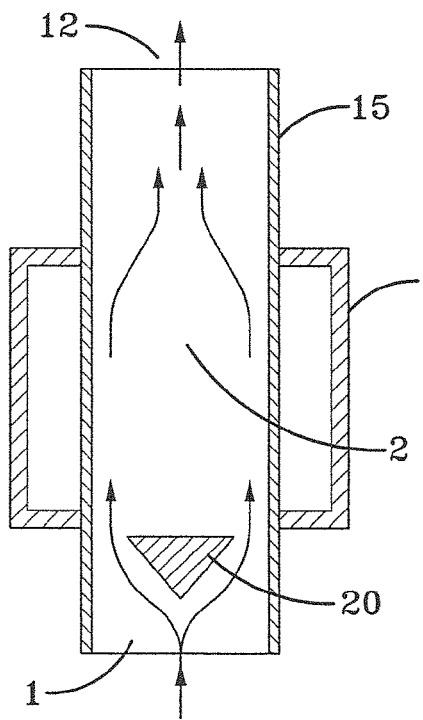

FIG. 3 shows a section of a device for plasma treatment with schematically indicated plasma chamber 2 and with a recipient 15, made of quartz glass, which is continued as a reaction tube. Cone 20, as a flow-forming element in the gas inlet 1, distributes the gas stream, indicated by arrows, and leads through the plasma chamber to the gas outlet, which is not shown. Behind the cone, a central, flow-reduced zone is formed.

Figure 4:
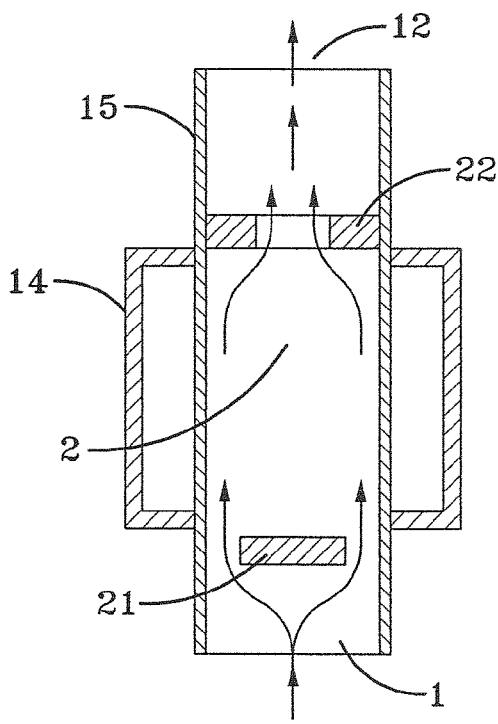
Figure 5:
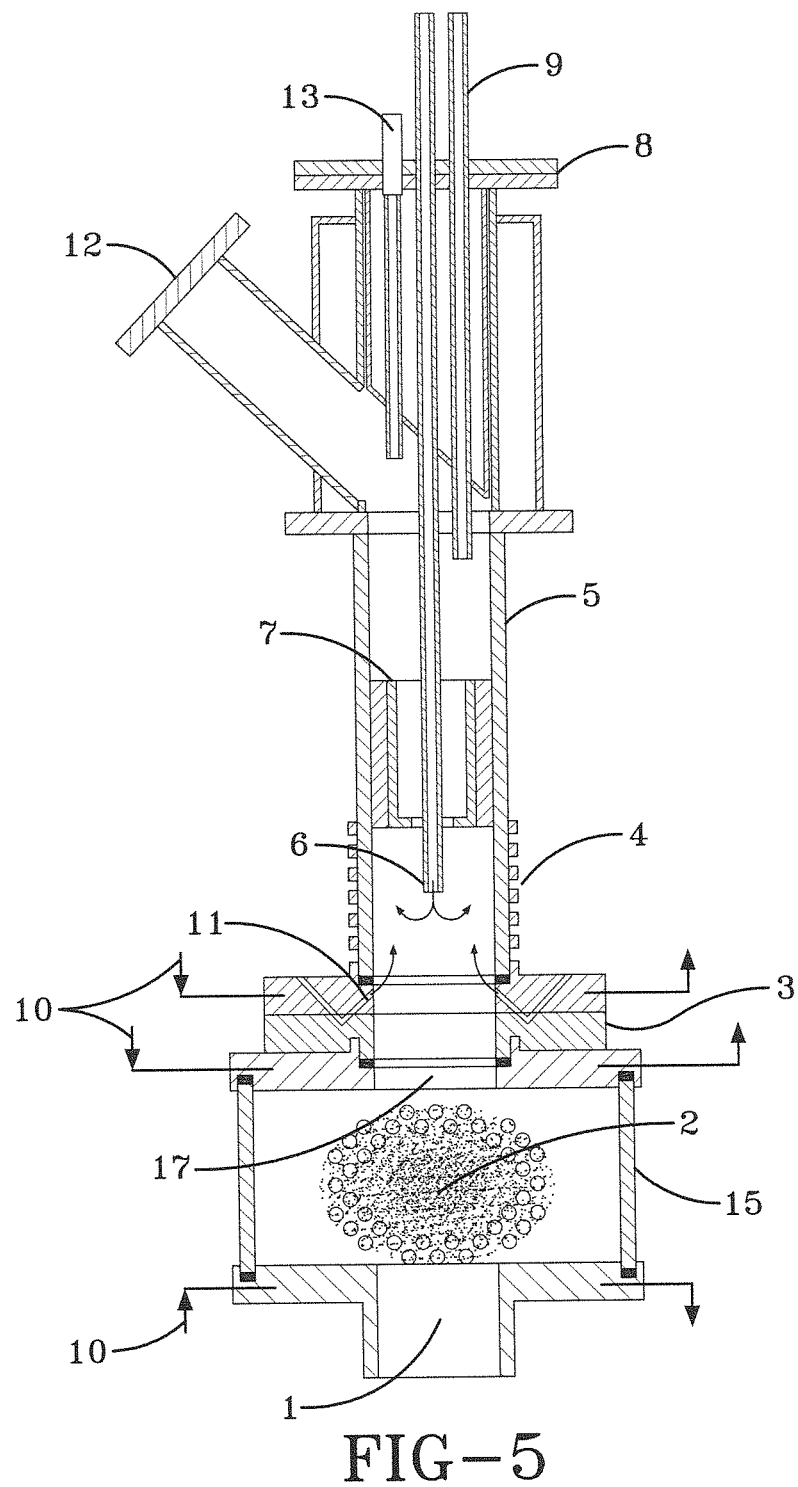

FIG. 4 shows a section of a device as shown in FIG. 3, but with a displaceable annular gap 21 at the gas inlet 1 and with a perforated orifice plate 22 leading to the reaction tube. The reaction tube and the plasma chamber have an uninterrupted wall 15. Suspensions and fine-particulate granulates can be guided, along with the gases, through the plasma reactor 2 and the reaction tube, and can be discharged at the outlet.

FIG. 6 shows examples of possible reactions.

What has been described above are preferred aspects of the present invention. It is of course not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, combinations, modifications, and variations that fall within the spirit and scope of the appended claims.

We claim:

1. A method for carrying out gas reactions using a device comprising:
    a plasma reactor having a plasma chamber for allowing a through-flow of gases;
    and at least one flow-forming element for forming the through-flow of gases, the at least one flow-forming element being adjustably arranged;
    said method comprising the steps of:
    passing a stream of gas or of gasifiable substances through a microwave-excited plasma in the plasma chamber at a volume flow rate of 0.1 $m^3/h$ to 1000 $m^3/h$, the gas stream comprising at least one reaction component which is converted while the gas stream is passed through the plasma chamber; and
    adjusting the at least one flow-forming element to form at least one zone in the gas stream to reduce the velocity of the gas flow and allowing the plasma to remain stable.

2. The method according to claim 1, wherein the at least one flow-forming element effects a rotation of the gas stream.

3. The method according to claim 1, comprising the step of recovering heat that is generated by carrying out the gas reaction by using a heat exchanger integrated in a reaction tube axially arranged downstream of the plasma chamber.

4. The method according to claim 1, further comprising the step of introducing gases or aerosols via nozzles, slots or tubes to control a temperature of the gas reaction.

5. The method according to claim 1, wherein the microwave-excited plasma is pulse-operated.

6. The method according to claim 1, wherein the microwave-excited plasma passed through the plasma chamber is non-thermal plasma.

7. The method according to claim 3, and further comprising the step of recovering heat by a heat exchanger integrated in the reaction tube, wherein said heat exchanger comprises a black exchange surface.

8. The method according to claim 4, wherein the gas includes hydrogen.

9. The method according to claim 4, wherein the step of introducing the gases or aerosols comprises introducing the gases or aerosols to control the temperature in the reactor.

10. The method according to claim 5, wherein the stream of gas or of gasifiable substances is pulse operated by pulse control in a microwave generator.

11. The method according to claim 5, and further comprising the step of feeding microwave power into the plasma chamber through a resonator, and pulse-operating the plasma by pulsed coupling of the microwaves into the resonator at pulse frequencies of from 1 Hz to 50 Hz.

12. The method according to claim 1, wherein the at least one flow-forming element is arranged at a position selected from the group consisting of before the plasma reactor, in the plasma reactor and after the plasma reactor.

13. The method according to claim 1, wherein the at least one flow-forming element comprises a configuration selected from the group consisting of cones, drops, annular gaps, diaphragms, grids, baffle bodies, vortex tubes, cyclones and turbines.

14. The method according to claim 1, wherein the flow forming elements are selected from the group consisting of nozzles, slots and tubes.

15. The method according to claim 2, wherein the at least one zone in which the velocity of the gas flow is reduced is in the rotation center of the rotating gas stream.

16. The method according to claim 2, wherein the at least one flow-forming element is selected from the group consisting of adjustable ring diaphragms, adjustable ring nozzles and tangentially feeding nozzles in annular arrangement.

17. The method according to claim 16, wherein the plasma reactor has a gas inlet and a gas outlet, and said at least one flow-forming element is provided at the gas inlet or at the gas outlet.

18. The method according to claim 16, wherein said plasma reactor has a reaction tube that is arranged axially after the reactor, and said at least one flow-forming element is provided at the beginning of the reaction tube.

19. The method according to claim 1, wherein the plasma reactor has a reaction tube that is arranged axially after the reactor, and wherein the method further comprises the step of feeding a selected one of further reaction components, auxiliary gases or liquid substances into the reaction tube at the beginning of the reaction tube.

20. The method according to claim 1, wherein the gas or gasifiable substance is selected from the group consisting of waste gases, residual gases from industrial processes, gaseous pollutants and vaporous pollutants.

21. The method according to claim 1, wherein the gas or gasifiable substance is selected from the group consisting of $CO_2$, $N_2$, $SF_6$, $CF_4$, $C_2F_6$, $H_2O$, $H_2$, $CO$, hydrocarbons, fluorochlorinated hydrocarbons, fluorohydrocarbons, chlorohydrocarbons, dioxin, furans, crude oil and natural gases.

22. The method according to claim 1, wherein the device has a reaction tube that is arranged axially after the reactor, and the method further comprises the step of introducing at least one catalyst into the reaction tube.

23. The method according to claim 1, wherein the gas stream contains a suspension or a granulate to be conveyed through the plasma reactor.

24. The method according to claim 1, wherein the gas stream is not impeded by any electrodes.

* * * * *